(12) United States Patent
Chien et al.

(10) Patent No.: US 7,177,334 B2
(45) Date of Patent: Feb. 13, 2007

(54) HIGH POWER DRIVER SYSTEM

(75) Inventors: Pi-Yao Chien, Taichung (TW); Bing Sheng, Hang-Zhou (CA); Yong Peng, Hang-Zhou (CA)

(73) Assignee: Asia Optical Co., Ltd., Taichung (TW)

( * ) Notice: Subject to any disclaimer, the term of this patent is extended or adjusted under 35 U.S.C. 154(b) by 217 days.

(21) Appl. No.: 10/889,909

(22) Filed: Jul. 13, 2004

(65) Prior Publication Data

US 2005/0135445 A1    Jun. 23, 2005

(30) Foreign Application Priority Data

Oct. 2, 2003   (TW) .............................. 92127345 A

(51) Int. Cl.
*H01S 3/00* (2006.01)
(52) U.S. Cl. .............................. 372/38.07; 372/38.02; 372/38.01
(58) Field of Classification Search ............. 372/38.07, 372/38.01, 38.02
See application file for complete search history.

(56) References Cited

U.S. PATENT DOCUMENTS 5,245,690 A * 9/1993 Aida et al. .................. 385/142

* cited by examiner

*Primary Examiner*—Minsun Oh Harvey
*Assistant Examiner*—Rory Finneren
(74) *Attorney, Agent, or Firm*—Thomas, Kayden, Horstemeyer & Risley

(57) ABSTRACT

A high power driver system has a predetermined number of driver modules for driving a high power device such as a laser-emitting device. Each driver module has a driver circuit and a corresponding feedback circuit. The driver circuits respectively generate driving currents, and then the driving currents are collected to drive the high power laser-emitting device or other high power devices. In addition, these feedback circuits of the driver modules receive the same detection signal that represents the output power of the high power laser-emitting device. Then, each feedback circuit responds to the same detection signal to generate a feedback signal, respectively, which makes the corresponding driver circuit carry out a feedback action for adjusting the driving currents.

9 Claims, 6 Drawing Sheets

HIGH POWER DRIVER SYSTEM

FIELD OF THE INVENTION

The present invention relates to a high power driver system, and more particularly, to a high power driver system having feedback functions.

BACKGROUND OF THE INVENTION

Laser was just used about 40 years ago. Since then, the laser industry has progressed greatly. Numerous kinds of laser have been developed in succession, for example, ruby laser (1960) followed by glass laser (1961), He—Ne laser (1962), semiconductor laser (1962), $CO_2$ laser (1964), X-ray laser (1972), excimer laser (1975), and free electron laser (1977). In addition, laser are very important and widely applied in communications, measurement, processing, medical treatment and so on.

Lasers with various structures and power are applied in various fields. For example, lasers used in household optical fiber communication are significantly different from those used in industrial cutting. Moreover, according to the applied properties, laser can be divided into pulse laser, continuously oscillating laser and the like. Of these, the majority of laser-emitting devices must be driven by high power.

In order to drive such a high power laser to achieve the required application, the laser-emitting device usually needs to be provided with a higher driving current, such as 10 amperes or more. However, the driver circuit designed for high current is complicated in its structure as well as expensive in cost. Hence, the high power laser-emitting device can be driven by a sufficiently high current collected by parallel connecting multiple driving currents in the prior art.

Reference is made to FIG. 1, which is a pulse-modulation laser system composed in accordance with the aforementioned method. The system has a high power laser-emitting device 10, a feedback circuit 12, a pulse-generating circuit 14, and N sets of driver circuits 161, 162, . . . , and 16N. The pulse-generating circuit 14 is employed to generate a pulse controlling signal to the driver circuits 161, 162, . . . , and 16N. The driver circuits 161, 162, . . . , and 16N respectively generate driving currents, and the driving currents are collected for driving the high power laser-emitting device 10. For example, a driving current of 10 amperes can be obtained by collecting the output of 100 driver circuits, where each driver circuit generates 0.1 amperes. Further, in order to keep the emitting power of the high power laser-emitting device 10 stable, the feedback circuit 12 is responsible for monitoring the power of the high power laser-emitting device 10, and provides a feedback signal to the driver circuits 161, 162, . . . , and 16N.

Since the prior art merely adopts a single feedback circuit 12, and all driver circuits 161, 162, . . . , and 16N are connected to the feedback circuit 12, if a driver circuit is broken, other driver circuits may be burned to induce a chain reaction. In addition, the prior method is not stable enough, as well as being very difficult to be repaired.

SUMMARY OF THE INVENTION

It is an aspect of the present invention is to provide a high power driver system and circuit thereof for driving a high power laser-emitting device. The high power drivering system and circuit thereof are also employed to drive other electronic devices that require a stable supply of high power current.

According to the aforementioned aspect of the present invention, a high power driver system is provided, which has a predetermined number of driver modules for driving a high power laser-emitting device. Each driver module is connected in parallel, is composed of a driver circuit and a corresponding feedback circuit. These driver circuits generate driving currents respectively, and then these driving currents are collected to drive the high power laser-emitting device. In addition, these feedback circuits receive the same detection signal which is reflected the output power of the high power laser-emitting device. The detection signal is generated from a laser power detecting device or obtained by detecting the variation of the inner current of the driver circuits. Then, according to the detection signal, the feedback circuits generate feedback signals to the corresponding driver circuit, respectively, which adjusts the driving currents according to the feedback signals.

In an exemplary embodiment, the high power driver system is applied to a pulse-modulation laser system, and hence a pulse-generating circuit is connected to the setting points of respective driver circuits for providing a setting signal. The driver circuit determines a value of the output driving current, for example, with 10 amperes or no current output, at a specific time according to the setting signal.

The high power driver system of the present invention is beneficial in the following ways. The high power driver system is very stable, safe and easy to be repaired. Otherwise, because it is based on a design concept in which feedback driver modules are connected in parallel independently, system shutdown caused by a chain reaction induced by a broken driver circuit can be prevented. In addition, the high power driver system is very expandable to achieve the driving current with various values theoretically by adding the driver modules. Moreover, the driver modules have exquisite circuits and are thus easily fabricated and cheap.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 2:
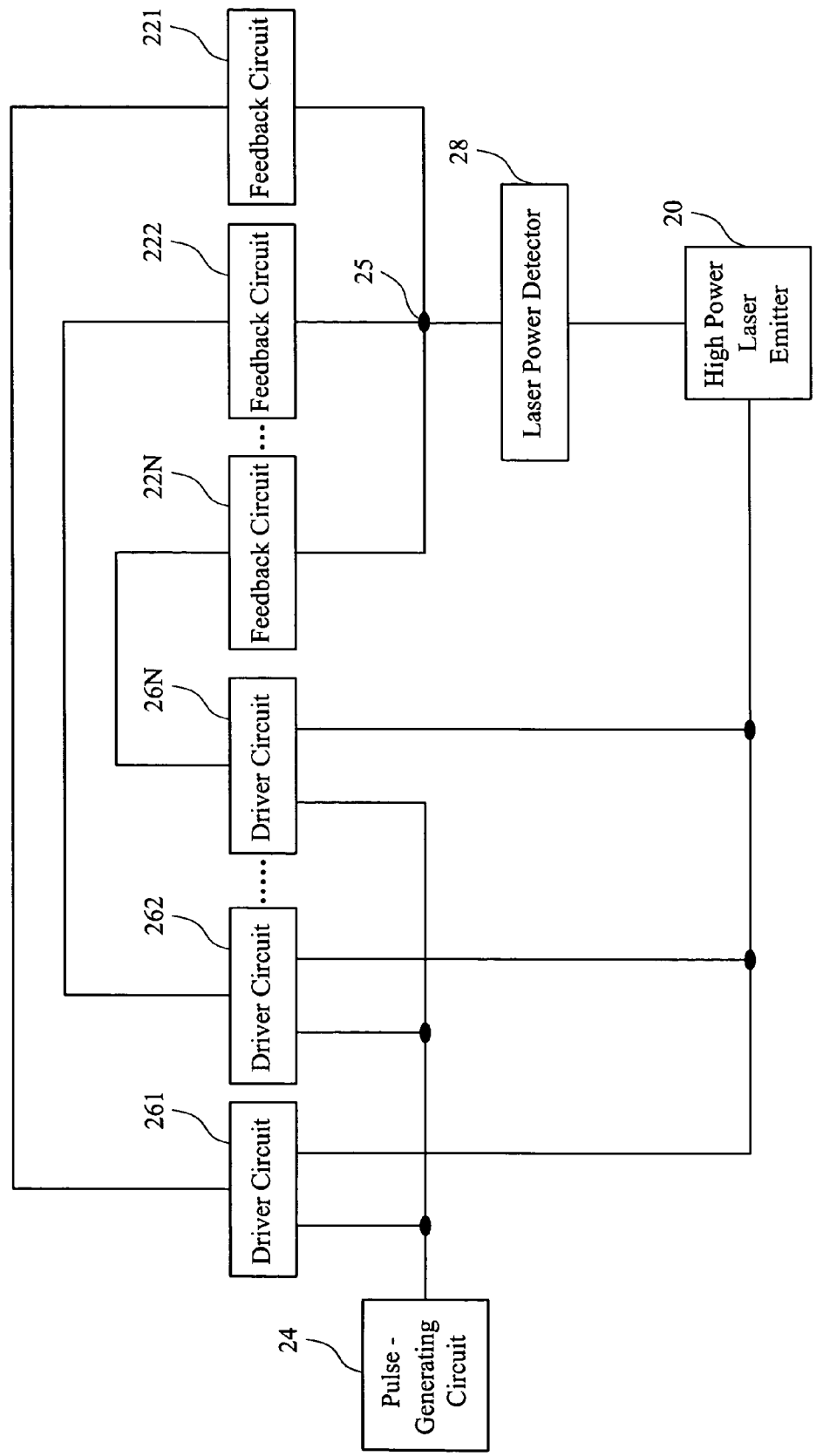
FIG. 2 is a schematic diagram of the high power driver system in accordance with a preferred embodiment of the present invention.

Reference is made to FIG. 2, which is a schematic diagram of the high power driver system in accordance with a preferred embodiment of the present invention. The high power driver system, illustrated with a pulse-modulation laser, comprise a high power laser-emitting device 20; a pulse-generating circuit 24; N numbers of feedback circuits 221, 222, . . . , and 22N; N numbers of driver circuits 261, 262, . . . , and 26N corresponding to the feedback circuits 221, 222, . . . , and 22N; and a laser power detecting device 28. N is an integer greater than 2.

The pulse-generating circuit 24 herein generates a pulse-controlling signal, which is also called as a setting signal, and transmits the pulse-controlling signal to the setting points of the driver circuits 261, 262, . . . , and 26N. For example, the output frequency of the pulse-controlling signal is 100 KHz and the pulse-width of the said signal is 1 MHz, that's to say, duty ratio is 1:10, and high potential level is 1 volt, and low potential level is 0 volt. Driver circuits according to said pulse-controlling signal to generate the drive current respectively, and then converges the drive currents to drive the high power laser emitting device 20. For example, when N is 100, that is to say, one hundred driver circuits that respectively generate 0.1 amperes through collecting all current, results in 10 amperes of driving current.

In addition, the present invention is characterized by providing each driver circuit 261, 262, . . . , and 26N with corresponding feedback circuits 221, 222, . . . , and 22N. The feedback circuits 221, 222, . . . , and 22N simultaneously receive a detection signal generated from the laser power detecting device 28 or the inner driver circuit 32' by parallel connection. The detection signal mainly reflects the variation of the output power of the high power laser-emitting device 20, or the variation of the driving current in the system. A monitor diode is used when the laser power detecting device 28 is embodied. Additionally, the feedback circuits 221, 222, . . . , and 22N provide independent feedback signals respectively to the driver circuits 261, 262, . . . , and 26N. Therefore, even if all feedback circuits 221, 222, . . . , and 22N receive the same signal from the common end 25, but some particular design, for example, setting various threshold values or limiting the range of the driving current, can be performed in the corresponding driver circuits 261, 262, . . . , and 26N. Also, integrated circuit chips can be fabricated by assembling feedback circuits 221, 222, . . . , and 22N with the corresponding driver circuits 261, 262, . . . , and 26N in pairs for reducing the whole cost.

It is understood that the driver circuit and the feedback circuit are connected in parallel to become a driver module, a plurality of the driver modules are connected in parallel with each other, and combined with a current source, a pulse-generating circuit, a detection signal and a laser-emitting device, thereby assembling a high power driver system. On the other hand, the present invention is applied to drive not only the high power laser, but also other devices that require a stable high power current, such as a transmitting device of high power microwave signal, a high power infrared emitting device, a high precision heating system, and the like.

Thereinafter, in order to describe the concept of the present invention more explicitly and completely, the following embodiments are illustrated as follows.

EXAMPLE 1

This example is suitable for application in driving a non-laser-emitting device or a laser-emitting device without a laser power detecting device. The feedback circuit of this example branches from the driver circuit 32', generates a detection signal according to the variation of the inner current of the driver circuit 32', so as to generate a stable output current and collect thereof to a driving current, and replaced the function of the laser power detecting device with this example. With respect to the detailed embodiment, reference is made to FIG. 3, which is a block diagram of the single feedback circuit 34' and the single corresponding driver circuit 32', in conjunction with FIG. 5, which is a circuit layout of the single feedback circuit 34' and the single corresponding driver circuit 32'.

Figure 3:
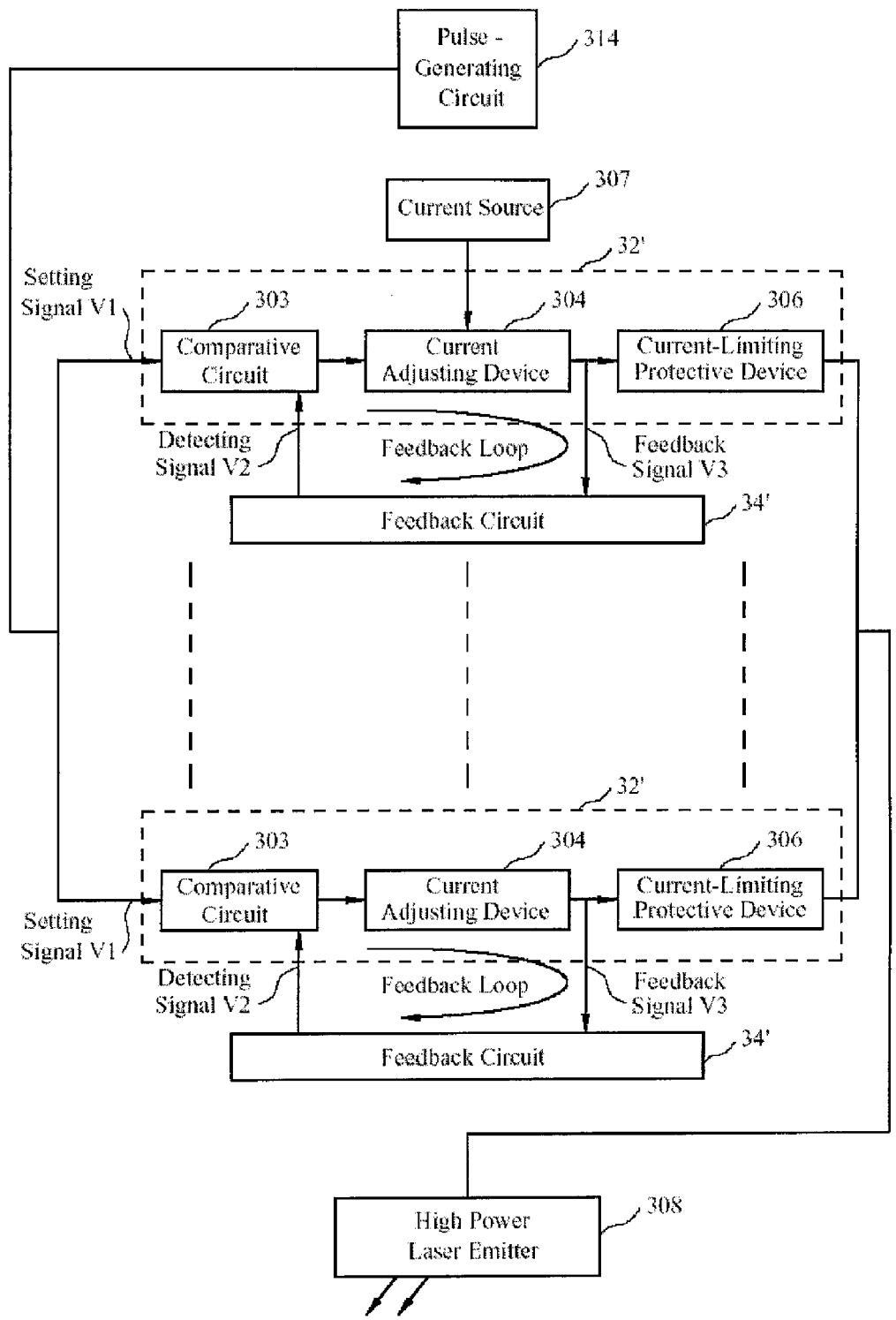
FIG. 3 is a block diagram of driver circuits in accordance with a preferred embodiment of the present invention.

The driver circuit 32' as shown in FIG. 3 comprises a comparison device 303, a current-adjusting device 304 and a current-limiting protection device 306. Meanwhile, the comparison device 303, the current-adjusting device 304 of the driver circuit 32' and the feedback circuit 34' form a feedback loop. The driver circuit 32' and the feedback circuit 34' are assembled to a driver module. Furthermore, the pulse-generating circuit 314 generates a setting signal V1 to the comparison device 303. The comparison device 303 compares the setting signal V1 with the detection signal V2 generated from the feedback circuit 34', and then the comparison device 303 outputs a controlling signal for controlling the current-adjusting device 304 to generate a stable output current corresponding to the setting signal V1.

Figure 5:
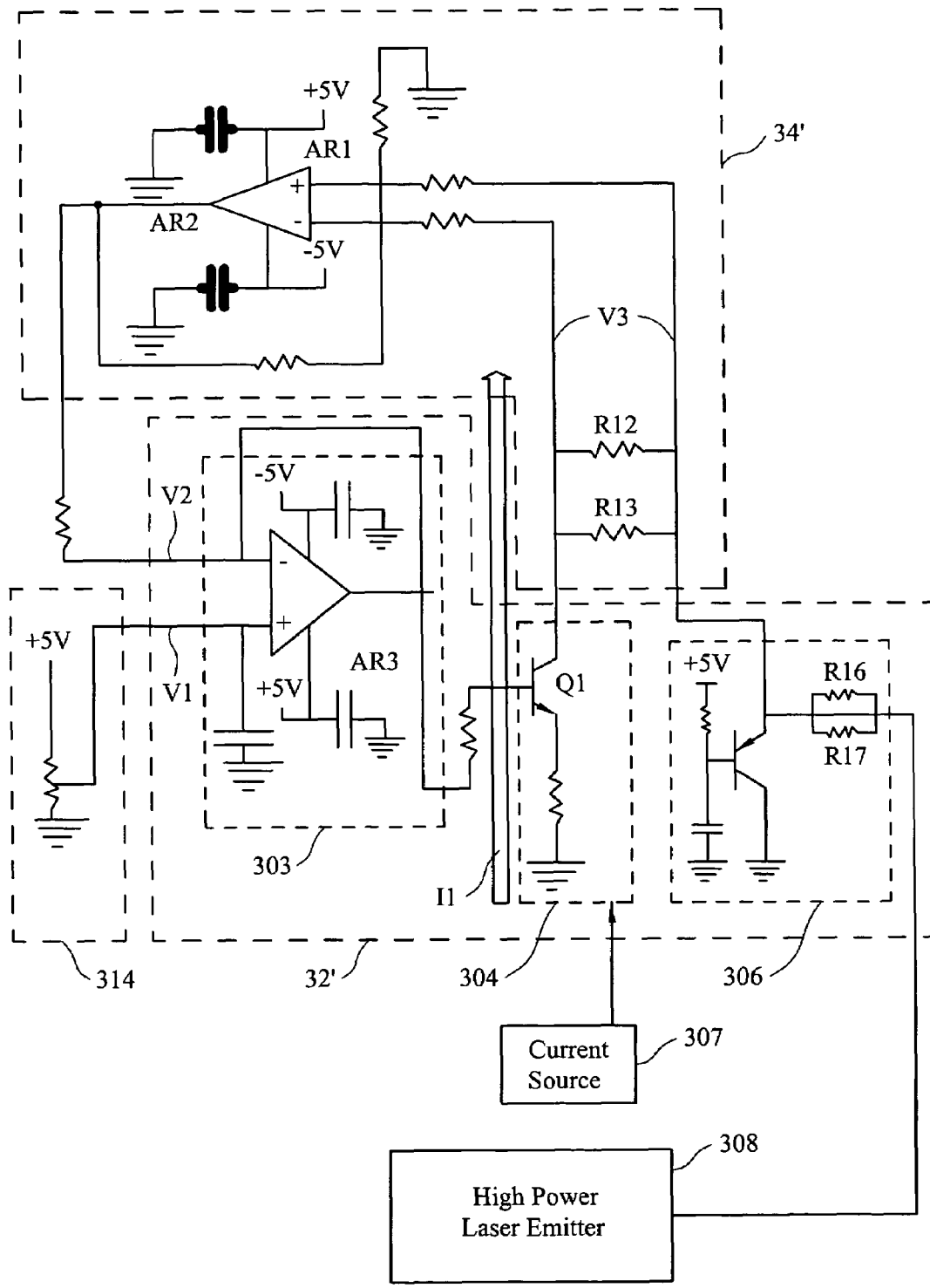
FIG. 5 is a circuit layout of a single driver module in accordance with a preferred embodiment of the present invention.

Reference is made to FIG. 5. The current-adjusting device 304 is composed of a transistor Q1, externally attached to a current source 307, and receives a controlling signal from the comparison device 303 composed of an operational amplifier (OPA) AR3 by a based (B). The current of the controlling signal adjusts the current of the current source 307 to generate a output current I1, and the output current I1 passing through the current-limiting protection device 306 composed of resistors R16 and R17 is collected to be a driving current to drive the high power laser-emitting device 308. Simultaneously, the current-limiting protection device 306 limits the output current to protect the laser-emitting device from damage due to burst transient current. In addition, the output current I1 is simultaneously shunted to the feedback circuit 34' composed of the resistors R12 and R13 and an OPA AR2. The resistors R12 and R13 are connected in parallel and across the positive and negative points of the OPA AR2, respectively. When the output current I1 passes through the resistors R12 and R13, a feedback signal V3 is generated thereon and a value thereof is equal to I1*(R12//R13), in which a potential of the feedback signal V3 is a difference between (V+) and (V−), and the values of (V+) and (V−) are inputted into the two points of the OPA AR2. Further, in the feedback circuit 34', the OPA AR2 is designed to be a differential amplifier with 2-fold magnification, in which the magnification factor must be dependent on the resistances of the resistors R12 and R13, and hence, the feedback circuit 34' may output a detection signal V2 with a value equal to 2[(V+)−(V−)] =2V3=2I1*(R12//R13). Accordingly, the detection signal V2 reflects the variation of the output current I1, and the detection signal V2 is transmitted to a (V−) end of the comparison device 303 composed of the OPA AR3, and compared with the setting signal V1 generated from a pulse-generating circuit 314 entered into a (V+)1 end of the OPA AR3. Then, a controlling signal is generated for adjusting the aforementioned output current I1. When (V−)>(V+) indicates that the feedback detection signal is higher than the setting signal, the comparison device 303 outputs a controlling signal of low potential to make the current-adjusting device 304 output a lower output current and reduce a potential of the feedback detection signal. Alternatively, the comparison device 303 outputs a controlling signal of high potential to the base of the current-adjusting device 304 composed of the transistor Q1. Based on the property of the transistor, Ic (the current of a collector)=βIb (the current of the base), Ic=I1 (the output current) and Ib is the controlling signal shown in FIG. 5. The output current increases according to the controlling signal until the detection signal is equal to the setting signal. A recursive correction process is performed several times, so as to control the output current corresponding to the setting signal V1, and the output currents generated from the driver modules are collected for a driving current. The output current I1 generated from the current-adjusting device 304 thus has a linear relationship with the setting signal V1 and responds to the feedback loop, through several repeated corrections and accumulations, leading to a stable output of driving current.

It is understood as above that the current-limiting protection device 306 only has a function for limiting currents to protect the laser-emitting device. Therefore, the present can be operated normally even without the current-limiting protection device 306.

EXAMPLE 2

This example is suitable for application in driving a laser-emitting device with a laser power detecting device 316. The laser power detecting device 316, according to a power of a high power laser-emitting device, generates a detection signal to a feedback circuit for reference to adjust the driving current. With respect to the detailed embodiment, reference is made to FIG. 4, which is a block diagram of the single feedback circuit 36' and the single corresponding driver circuit 32', in conjunction with FIG. 6, which is a circuit layout of the single feedback circuit 36' and the single corresponding driver circuit 32'.

Figure 4:
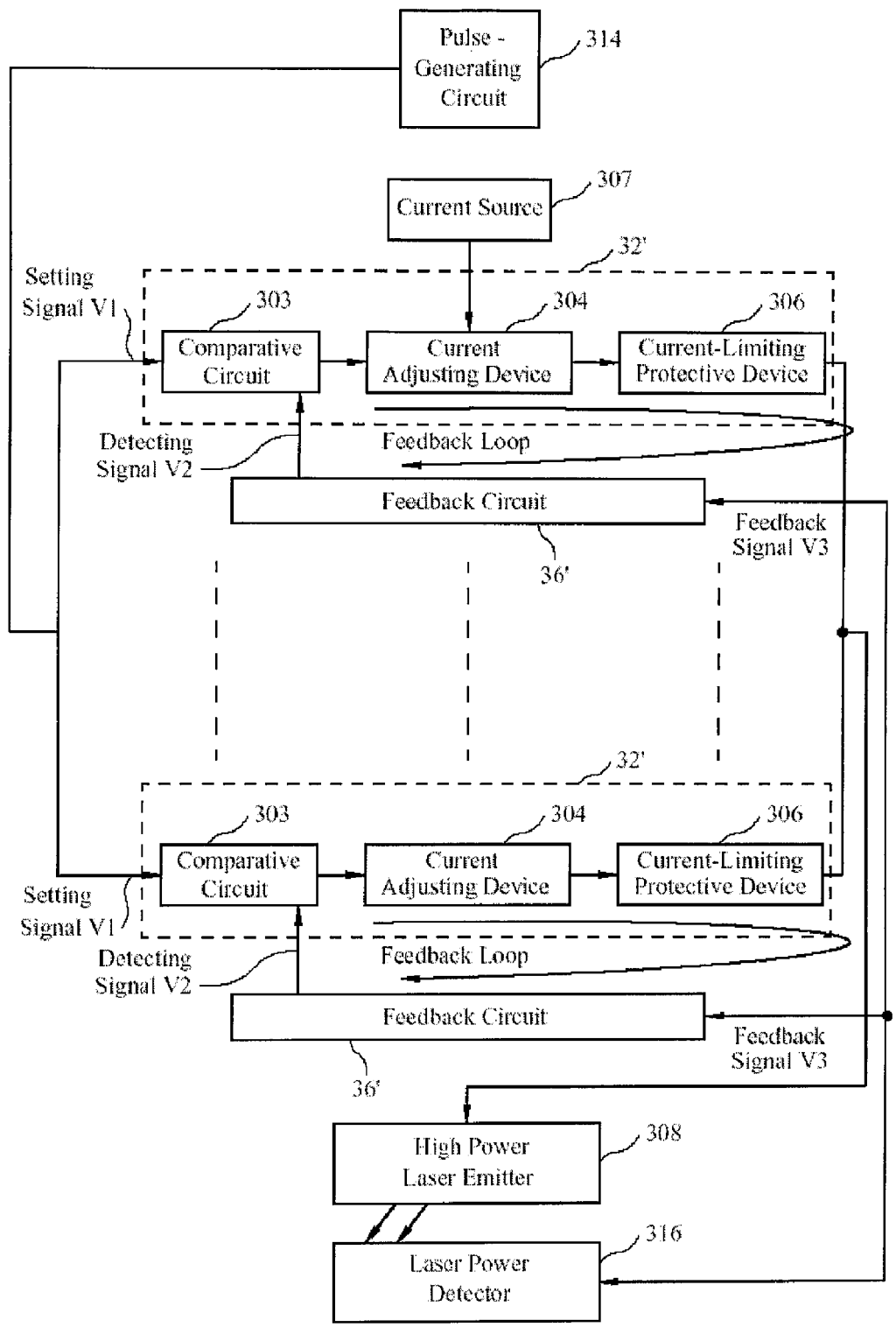
FIG. 4 is a block diagram of driver circuits in accordance with another preferred embodiment of the present invention.

The driver circuit 32' as shown in FIG. 4, includes a comparison device 303, a current-adjusting device 304 and a current-limiting protection device 306. Meanwhile, the comparison device 303, the current-adjusting device 304 and the current-limiting protection device 306 of the driver circuit 32', as well as the laser power detecting device 316 and the feedback circuit 36', form a feedback loop. The driver circuit 32' and the feedback circuit 36' are assembled to a driver module. Furthermore, the pulse-generating circuit 314 generates a setting signal V1 for controlling the current-adjusting device 304 to generate an output current corresponding to the setting signal V1.

Figure 6:
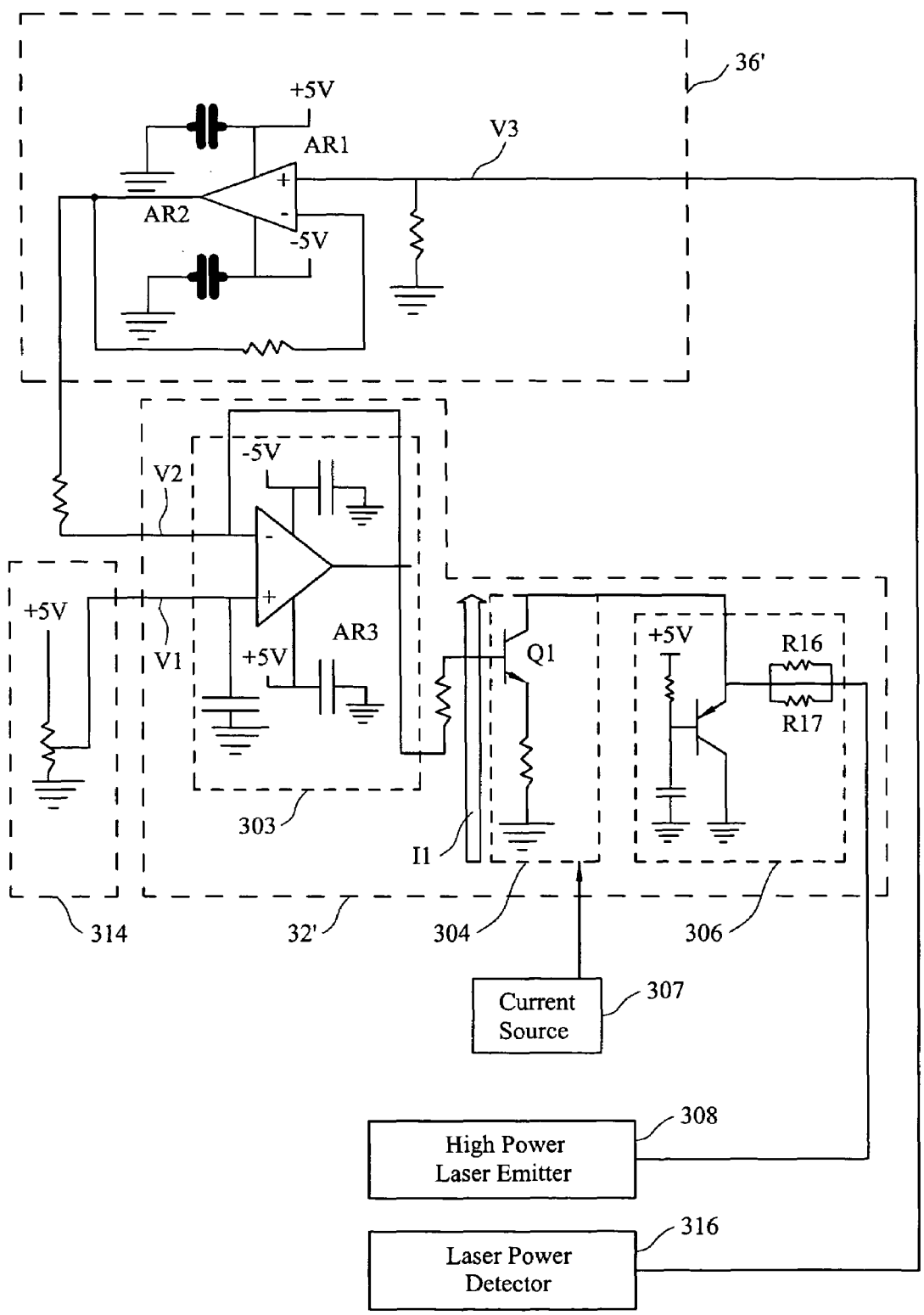
FIG. 6 is a circuit layout of a single driver module in accordance with another preferred embodiment of the present invention.

Reference is made to FIG. 6, in which the current-adjusting device 304 is composed of a transistor Q1, externally attached to a current source 307, and receives a controlling signal from the comparison device 303 composed of an operational amplifier (OPA) AR3 by a based (B). The current source 307 generate a output current I1 according to the magnitude of the controlling signal, and the output current I1 passing through the current-limiting protection device 306 composed of resistors R16 and R17 are collected to be a driving current to drive the high power laser-emitting device 308. In the meanwhile, the current-limiting protection device 306 limits the output current to prevent the laser-emitting device from damage due to burst transient current. At the same time, the laser power detecting device 316, according to the emitting power of the high power laser-emitting device 308, generates a feedback signal V3 and transmits the same back into the feedback circuit 36' composed of an OPA AR1. For the time being, the feedback circuit 36' is a simple voltage follower.

To ensure that the feedback signal V3 does not decay due to impedance matching, the feedback signal V3 is equal to the detection signal V2, and the detection signal V2 is completely transferred into the (V−) end of the comparison device 303 composed of the OPA AR3, and compared with the setting signal V1 generated from a pulse-generating circuit 314 entered into a (V+) end of the OPA AR3. A controlling signal is then generated for adjusting the aforementioned output current I1. When (V−)>(V+), the comparison device 303 outputs a controlling signal of low potential to control the current-adjusting device 304 to output a lower output current. Alternatively, the comparison device 303 outputs a controlling signal of high potential to the base of the current-adjusting device 304 composed of the transistor Q1. The property of the transistor is utilized to adjust the output current. A recursive correction process is performed several times, so as to control the output current corresponding to the setting signal V1, and the output currents generated from the driver modules are collected for a driving current; whereby the current generated from the current-adjusting device 304 has a linear relationship with the setting signal and responds to the feedback loop, through several repeated corrections and accumulations, leading to a stable output of the driving current.

It is understood as above that the feedback circuit 36' is a buffered device for simply transferring the detection signal generated from the laser power detecting device 316 to the comparison device 303, and the current-limiting protection device 306 only has a function for protecting the laser-emitting device. Therefore, the present invention can be operated normally even without the feedback circuit 36' and the current-limiting protection device 306.

Based on the aforementioned setting conditions, if the power of the high power laser changes due to temperature or other factors, it can be compensated with the feedback method of the present invention for keeping the output power stable. Similarly, more driver circuits, either the same or different, and feedback circuits can be connected in parallel in the whole system for fitting the requirement of the system design.

Figure 1:
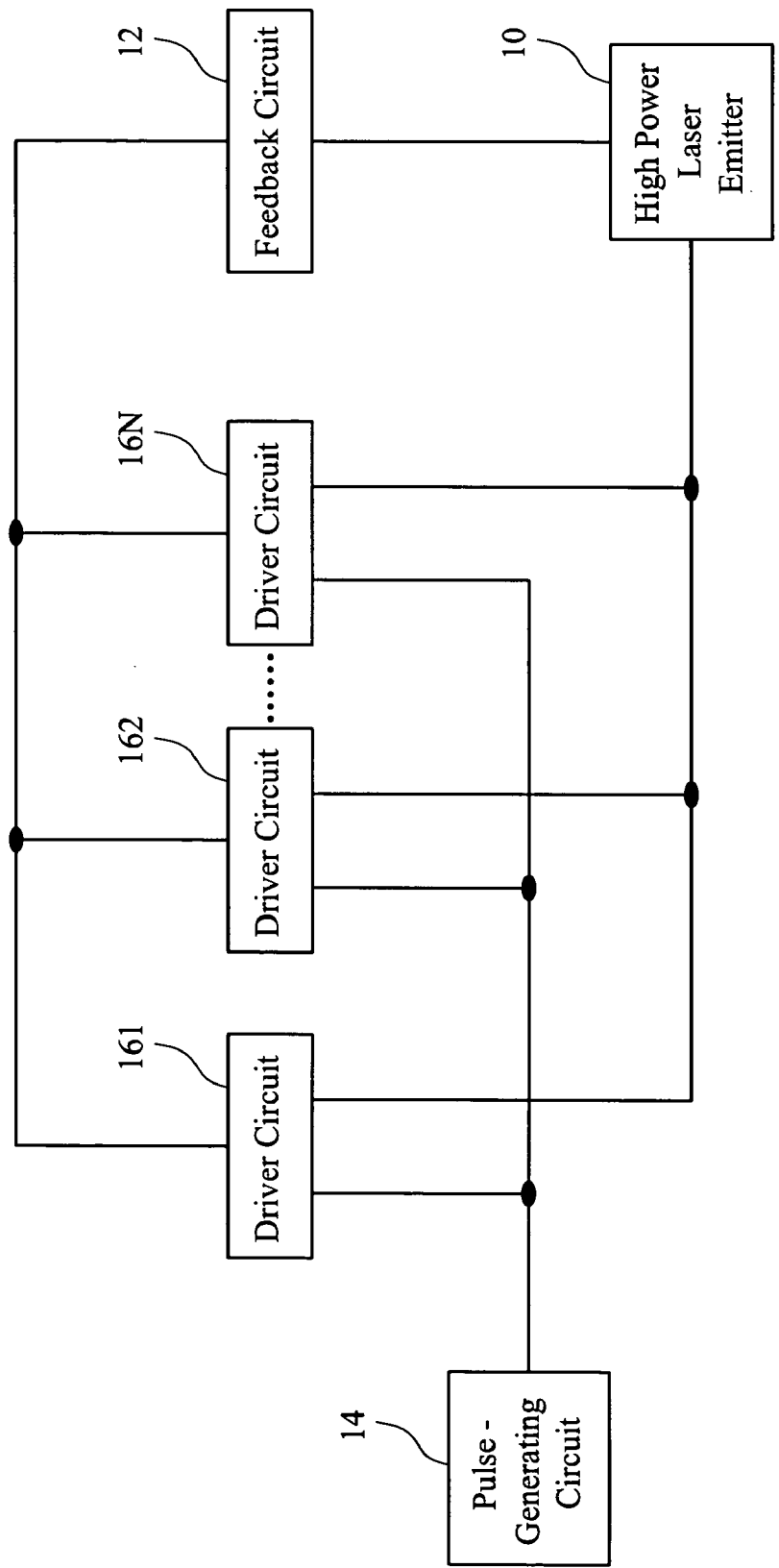
FIG. 1 is a pulse-modulation laser system according to the prior art.

When compared with the design method of the prior art, as shown in FIG. 1, merely a single feedback circuit 102 is used; consequently, it is not suitable for freely expanding the driver circuits 261, 262, . . . , and 26N, and certainly limited in the design of the driver circuits 261, 262, . . . . On the other hand, in the design of the laser system according to the present invention, the driver module is composed of the feedback circuits 221, 222, . . . , and 22N and the driver circuits 261, 262, . . . , and 26N in pairs, respectively, for freely expanding the driver circuits. Theoretically, the driving current can be infinitely raised for fitting various specification of various high power laser-emitting devices.

Moreover, the feedback laser driver circuit is adopted in the present invention, the pulse signal received by the feedback point can be identical to the one output by the setting point, and thus, the signals are not affected by the numbers of the parallel-connected circuits. Furthermore, feedback pulse laser driver circuits are connected in parallel independently, and the whole system is not affected when a driver circuit breaks, so as to ensure stability of the system. Additionally, the present invention is adopted with plural feedback pulse laser driver circuits connected in parallel independently, so as to prevent system shutdown caused by a chain reaction, which is induced when a driver circuit breaks and its current is shared out among other driver circuits, causing the other driver circuits to burn. Hence, the system of the present invention is very safe and easy to repair. In addition, the laser driver system also can directly control the output current by controlling the voltage of the setting point. Further, the system is easy to manufacture and cheap.

Of course, it is necessary to mention that a pulse-modulation laser is illustrated herein as an embodiment, but is not to be construed as a limitation of the present invention. By using several combinations of driver circuits and feedback circuits connected in parallel, each driver circuit and its corresponding feedback circuit can be used as a driver module, and the driver module is further employed to drive various high power emitting device.

As is understood by a person skilled in the art, the foregoing preferred embodiments of the present invention are illustrative rather than limiting of the present invention. It is intended that various modifications and similar arrangements be included within the spirit and scope of the appended claims, the scope of which should be accorded the broadest interpretation so as to encompass all such modifications and similar structure.

What is claimed is:

1. A high power driver system, providing a driving current to make a laser-emitting device generate a light beam, comprising: a laser power detecting device for detecting an intensity of the light beam and generating a detection signal; a plurality of driver modules connected in parallel with each other for generating output currents respectively to the laser-emitting device; a current source for providing a quantity of current for the driver modules; and a pulse-generating circuit for generating a setting signal to the driver modules, wherein the driver modules output a controlling signal for adjusting a degree of the output currents after the driver modules compare the setting signal with the detection signal; whereby the output currents are stably output and collected into the driving current by connecting the driver modules in parallel.

2. The high power driver system according to claim 1, wherein each of the driver modules comprises: a comparison device for comparing the detection signal with the setting signal to output the controlling signal; and a current-adjusting device for adjusting the output currents according to the controlling signal.

3. The high power driver system according to claim 1, wherein each of the driver modules comprises: a feedback circuit for maintaining a level of the detection signal; a comparison device for comparing the detection signal with the setting signal to output the controlling signal; and a current-adjusting device for adjusting the output currents according to the controlling signal.

4. The high power driver system according to claim 1, wherein each of the driver modules comprises: a comparison device for comparing the detection signal with the setting signal to output the controlling signal; a current-adjusting device for adjusting the output currents according to the controlling signal; and a current-limiting protection device for limiting the output currents to protect the laser-emitting device.

5. The high power driver system according to claim 1, wherein each of the driver modules comprises: a feedback circuit for maintaining a level of the detection signal; a comparison device for comparing the detection signal with the setting signal to output the controlling signal; and a current-adjusting device for adjusting the output currents according to the controlling signal; and a current-limiting protection device for limiting the output currents to protect the laser-emitting device.

6. A high power driver system comprising a plurality of parallel driver modules, a current source and a pulse-generating circuit, and providing a predetermined value of a driving current to make a laser-emitting device generate a light beam, wherein the pulse-generating circuit generates a setting signal representing output currents generated from the driver modules, each driver module comprising: a current-adjusting device coupled to the current source for generating the output currents according to a controlling signal; a feedback circuit for measuring the output currents to generate a detection signal representing the output currents; and a comparison device for outputting the controlling signal to adjust the output currents generated by the current-adjusting device after comparing the detection signal with the setting signal; whereby a sum of the output currents equals the predetermined value of the driving current when the driver modules are connected in parallel.

7. The high power driver system according to claim 6, wherein each of the driver modules comprises: a current-limiting protection device for limiting the output currents to protect the laser-emitting device.

8. The high power driver system according to claim 6, wherein the current-adjusting device comprises a transistor for determining a value of the output currents in response to the controlling signal generated by the comparison device.

9. The high power driver system according to claim 6, wherein the comparison device comprises an operational amplifier (OPA), and wherein the OPA compares the detection signal generated by the feedback circuit with the setting signal generated by the pulse-generating circuit and generates the controlling signal to the current-adjusting device.

* * * * *